(12) United States Patent
Seo et al.

(10) Patent No.: US 9,564,483 B2
(45) Date of Patent: Feb. 7, 2017

(54) DISPLAY DEVICE AND MANUFACTURING METHOD THEREOF

(71) Applicant: Samsung Display Co., Ltd., Yongin-si, Gyeonggi-do (KR)

(72) Inventors: Il Hun Seo, Asan-si (KR); Ji Youn Lee, Anyang-si (KR); Byoung Ki Kim, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/856,136

(22) Filed: Sep. 16, 2015

(65) Prior Publication Data

US 2016/0284782 A1 Sep. 29, 2016

(30) Foreign Application Priority Data

Mar. 23, 2015 (KR) ........................ 10-2015-0040044

(51) Int. Cl.
| | |
|---|---|
| *H01L 27/14* | (2006.01) |
| *H01L 27/32* | (2006.01) |
| *H01L 51/00* | (2006.01) |
| *H01L 27/12* | (2006.01) |
| *H01L 51/05* | (2006.01) |
| *H01L 29/786* | (2006.01) |

(52) U.S. Cl.
CPC ....... *H01L 27/3276* (2013.01); *H01L 27/3246* (2013.01); *H01L 27/3248* (2013.01); *H01L 51/0097* (2013.01); *H01L 27/12* (2013.01); *H01L 29/78621* (2013.01); *H01L 51/0036* (2013.01); *H01L 51/0545* (2013.01); *H01L 2227/323* (2013.01)

(58) Field of Classification Search
CPC .. H01L 27/775; H01L 27/12; H01L 29/66757; H01L 29/78621; H01L 51/0545; H01L 51/0036; H01L 51/0541; H01L 51/5012; H01L 27/3276; H01L 27/3246; H01L 27/3248
USPC ......... 257/72, 40, 59, 88, E51.001, E51.018, 257/E27.111, E21.007; 438/34, 48, 128, 149
See application file for complete search history.

(56) References Cited

U.S. PATENT DOCUMENTS

| | | | |
|---|---|---|---|
| 8,829,508 B2 * | 9/2014 | Park | H01L 27/3225 257/40 |
| 2014/0048778 A1 * | 2/2014 | Park | H01L 27/3225 257/40 |
| 2015/0163939 A1 * | 6/2015 | Park | H01L 27/3276 361/749 |

FOREIGN PATENT DOCUMENTS

| | | |
|---|---|---|
| KR | 20-0389047 Y1 | 7/2005 |
| KR | 10-2005-0077101 A | 8/2005 |
| KR | 10-0672622 B1 | 1/2007 |
| KR | 10-2008-0008703 A | 1/2008 |

(Continued)

*Primary Examiner* — Thinh T Nguyen
(74) *Attorney, Agent, or Firm* — Knobbe Martens Olson & Bear LLP

(57) ABSTRACT

A display device comprises a base substrate, a first metal layer formed over the base substrate, an interlayer insulating layer formed over the first metal layer and comprising a contact hole, a second metal layer formed over the interlayer insulating layer and connected with the first metal layer through the contact hole, an anisotropic conductive film formed over the second metal layer and covering the contact hole, and a flexible circuit board attached to the anisotropic conductive film and configured to transmit a driving signal for the array of pixels. The first metal layer comprises a molten portion formed in the non-display area.

11 Claims, 6 Drawing Sheets

(56) References Cited

FOREIGN PATENT DOCUMENTS

KR  10-2009-0003753 A   1/2009
KR  10-2013-0063536 A   6/2013

* cited by examiner

DISPLAY DEVICE AND MANUFACTURING METHOD THEREOF

RELATED APPLICATIONS

This application claims priority to and the benefit of Korean Patent Application No. 10-2015-0040044 filed in the Korean Intellectual Property Office on Mar. 23, 2015, the entire contents of which are incorporated herein by reference.

BACKGROUND

1. Field

The described technology relates generally to a display device, and more particularly, it relates to a display device such as a liquid crystal display, a plasma display device, an organic light emitting device, a field emission display, and the like.

2. Description of the Related Art

Display devices such as a liquid crystal display (LCD), a plasma display panel (PDP), an organic light emitting diode (OLED) device, a field emission display (FED), and the like are provided with a display panel and a driving circuit portion for driving the display panel.

A plurality of integrated circuits (ICs) in the driving circuit portion are electrically connected to a bonding pad of the display panel driving circuit portion through a tape carrier package (TCP), chip on glass (COG), or chip on flexible printed circuit (COF) installation method.

The above information disclosed in this Background section is only to enhance the understanding of the background of the described technology and therefore it may contain information that does not form the prior art that is already known in this country to a person of ordinary skill in the art.

SUMMARY

The described technology has been made in an effort to provide a display device that can prevent the wire rip-off of a pad portion from unexpectedly spreading to a display portion during a rework process.

According to one aspect of the embodiment, a display device including a display area where an image is displayed and a non-display area where an image is not displayed is provided. The display device includes: a base substrate; a first metal layer formed on the base substrate; an interlayer insulating layer formed on the first metal layer and including a contact hole; a second metal layer formed on the interlayer insulating layer and connected with the first metal layer through the contact hole; an anisotropic conductive film formed on the second metal layer and covering at least the contact hole; and a flexible circuit board attached to the anisotropic conductive film and to which a driving signal is transmitted from an external source, wherein the first metal layer includes a molten pattern formed in the non-display area.

A driving circuit may be mounted on the flexible circuit board.

The first metal layer may include a driving gate electrode layer.

The second metal layer may include a driving data electrode layer.

The molten pattern may be disposed farther from the display area than the contact hole.

The molten pattern may be lower in height than the first metal layer.

The molten pattern may be formed by irradiating a laser on the first metal layer.

In the interlayer insulating layer, a portion neighboring the molten pattern may be opened toward the molten pattern.

The molten pattern may be formed parallel with an end of the base substrate.

Two or more molten patterns may be disposed separately to be parallel to each other.

A lower insulating layer may be provided between the base substrate and the first metal layer.

The display device according to the embodiment forms a predetermined molten pattern or portion in a pad portion to reinforce a bonding force around the molten portion or pattern so as to reduce or minimize the wire ripping off in the pad portion during a rework process and spreading of such ripping-off toward the display area.

Further, according to the embodiment, the molten pattern is formed without a complex process not only in a small-size display device but also in a large-size display device such as a television, thus defects such as wire rip-off in the pad portion during the rework process can be easily prevented.

One aspect of the invention provides a display device comprising a display area which comprises an array of pixels configured to display an image and a non-display area connected to the display area. The display device may comprise: a base substrate; a first metal layer formed over the base substrate; an interlayer insulating layer formed over the first metal layer and comprising a contact hole; a second metal layer formed over the interlayer insulating layer and connected with the first metal layer through the contact hole; an anisotropic conductive film formed over the second metal layer and covering the contact hole; and a flexible circuit board attached to the anisotropic conductive film and configured to transmit a driving signal for the array of pixels, wherein the first metal layer comprises a molten portion formed in the non-display area.

In the foregoing device, a driving circuit may be mounted over the flexible circuit board. The first metal layer may comprise a driving gate electrode layer. The second metal layer may comprise a driving data electrode layer. The molten portion may be disposed farther from the display area than the contact hole. The first metal layer comprises first and second non-molten portions disposed between the flexible circuit board and the base substrate and separated from each other by the molten portion which is lower in height than the first and second non-molten portions of the first metal layer. The molten portion may be formed by irradiating a laser on a portion of the first metal layer to melt the portion and re-solidifying the portion.

Still in the foregoing device, the interlayer insulating layer may comprise a hole to receive a portion of an anisotropic conductive film which contacts the molten portion. The molten portion may extend generally parallel to an edge of the base substrate. The display device may further comprise an additional molten portion disposed separately to be generally parallel to the molten portion. The display device may further comprise a lower insulating layer provided between the base substrate and the first metal layer.

Another aspect of the invention provides a method of making a display device, which may comprise: forming a plurality of pixels over a base substrate; forming a first metal layer over the base substrate, the first metal layer being electrically connected to the plurality of pixels; forming a first insulation layer over the first metal layer; before or after forming the first insulation layer, melting a portion of the first metal layer and re-solidifying the portion, thereby forming a molten portion of the first metal layer; and bonding a flexible circuit board to the first insulation layer, the first metal layer and the base substrate, wherein an anisotropic conductive film is interposed between and electrically interconnects the flexible circuit board and the first metal layer.

In the foregoing method, the first metal layer may comprise first and second non-molten portions separated by the molten portion, the second non-molten portion being disposed between the molten portion and the plurality of pixels. The molten portion may have a thickness smaller than the first and second non-molten portions. The molten portion may have a metallic microstructure substantially different from that of the first and second non-molten portions. The method may further comprise detaching the flexible circuit board and the anisotropic conductive film from the base substrate, wherein the first non-molten portion is at least partly separated from the base substrate when detaching the flexible circuit board whereas the second non-molten portion is not separated from the base substrate. The method may further comprise bonding another flexible circuit board to the first metal layer and the base substrate, wherein another anisotropic conductive film is interposed between and electrically interconnects the other flexible circuit board and the first metal layer, wherein the second non-molten portion electrically interconnects the other flexible circuit board and the plurality of pixels.

Still in the foregoing method, the method may further comprise: forming a second insulation layer over the second non-molten portion, the second insulation layer defining a contact hole; forming a second metal layer over the second insulating layer with an electrical connection with the first metal layer through the contact hole; and forming a protective layer formed over the second metal layer and the second insulation layer, the protective layer defining a via hole through which the anisotropic conductive film is electrically connected to the second metal layer. The anisotropic conductive film may directly contact the base substrate. The anisotropic conductive film might not directly contact the first metal layer.

DETAILED DESCRIPTION

Figure 1:
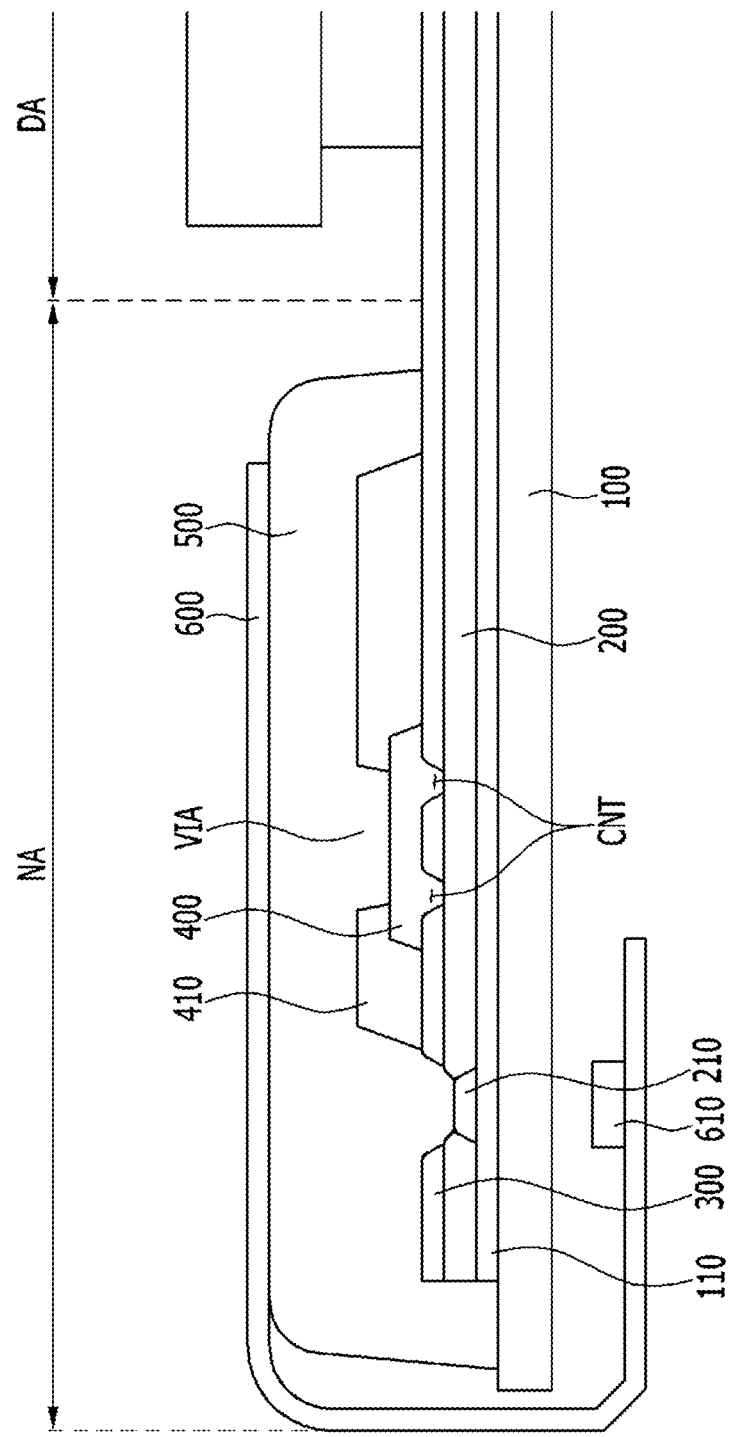
FIG. 1 is a schematic cross-sectional view of a display device according to an embodiment.

Hereinafter, embodiments will be described in detail with reference to the accompanying drawings. As those skilled in the art would realize, the described embodiments may be modified in various different ways, all without departing from the spirit or scope of the described technology. On the contrary, embodiments introduced herein are provided to make disclosed contents thorough and complete, and to sufficiently transfer the spirit of the described technology to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening elements may also be present, and the word "on" means positioning on or below the object portion, but does not essentially mean positioning on the upper side of the object portion based on a gravitational direction. Like reference numerals designate like elements throughout the specification.

In a display device, during circuit installation, a circuit is connected to the display panel using an anisotropic conductive film (ACF). The ACF is manufactured in the form of a film by dispersing conductive particles in an insulating adhesive resin. Terminals that exclusively require an electrical connection between them can simply be electrically connected by using the ACF.

When a circuit failure, a failure in a COF, or a failure from a bonding defect occurs after circuit installation using the ACF, the installed circuit is separated and a new circuit is installed through a rework process.

However, in the process of reworking the defective COF, a metal wire connected to an anisotropic conductive film may be ripped off or an insulating layer connected to the anisotropic conductive film may be partially ripped off when the COF is removed by ripping due to the strong adhesiveness of the anisotropic conductive film, and the ripping of the wire in the pad portion spreads, thereby causing damage to the wire or a display element.

Hereinafter, a display device according to an embodiment will be described with reference to FIG. 1 to FIG. 5. Referring to FIG. 1 to FIG. 5, a display device will be exemplarily described as an organic light emitting diode (OLED) display for convenience.

However, the display device according to the embodiment is not limited to the OLED display, and it may be a liquid crystal display (LCD), a plasma display panel (PDP), a field effect display (FED), an electrophoretic display device, and the like.

A display device 10 according to the embodiment includes a display area DA and a non-display area NA. The display area DA is an area where an array of pixels is located. Each pixel may include a thin film transistor and a display element. The display area DA displays an image according to a driving signal. The non-display area NA is an area formed at the peripheral area of the display area DA and where electrode pad portions are provided for connection between a driving circuit and wires that control the display area DA. The non-display area NA does not display an image.

The display device 10 according to the embodiment includes a base substrate 100, a first metal layer 200, an interlayer insulating layer 300, a second metal layer 400, an anisotropic conductive film 500, and a flexible circuit board 600, and a molten portion 210 is formed in the non-display area DA of the first metal layer 200.

First, the display area DA of the organic light emitting display device according to the embodiment will be schematically described.

The display device 10 includes a plurality of signal lines and pixels respectively connected thereto. The pixels may be one of red pixels R, green pixels G, or blue pixels B.

The signal lines include gate lines transmitting a scanning signal, data lines transmitting a data signal, and driving voltage lines transmitting a driving voltage.

The gate lines are substantially extended in a row direction approximately parallel to each other, and the data lines are substantially extended in a column direction approximately parallel to each other. The driving voltage lines are substantially extended in a column direction, but may also be extended in a row direction or column direction, or may be formed in a net shape.

Each pixel includes a thin film transistor including a switching transistor and a driving transistor, a storage capacitor, and an organic light emitting element. In embodiments, each pixel may further include an additional thin film transistor and a capacitor to compensate for a current supplied to the organic light emitting element.

The switching transistor includes a control terminal, an input terminal, and an output terminal. In this case, the control terminal is connected to the gate line, the input terminal is connected to the data line, and the output terminal is connected to the driving transistor.

The switching transistor transmits the data signal transmitted from the data line to the driving transistor in response to the scanning signal transmitted from the gate line.

In addition, the driving transistor includes a control terminal, an input terminal, and an output terminal. The control terminal is connected to the switching transistor, the input terminal is connected to the driving voltage line, and the output terminal is connected to the organic light emitting element.

The driving thin film transistor outputs an output current, the magnitude of which varies according to a voltage applied between the control terminal and the output terminal.

The capacitor is connected between the control terminal and the input terminal of the driving transistor. The capacitor charges a data signal applied to the control terminal of the driving transistor and maintains the charge of the data signal after the switching transistor is turned off.

The organic light emitting element, as an organic light emitting diode (OLED), includes an anode connected to the output terminal of the driving transistor and a cathode connected to a common voltage. The organic light emitting diode displays an image by emitting light, the strength of which varies depending on a current of the driving transistor.

The organic light emitting element LD may include an organic material which uniquely expresses any one or more primary colors, such as the three primary colors red, green, and blue, and the organic light emitting diode display displays a desired image by a spatial sum of the colors.

The switching transistor and the driving transistor are field effect transistors (FET), but at least one may be a p-channel field effect transistor. Further, a connection relationship among the transistors, the storage capacitor, and the organic light emitting element may be changed.

Hereinafter, the non-display area NA of the display area 10 will be described with reference to FIG. 1 and FIG. 2.

First, referring to FIG. 1, a driving circuit 610 driving an emission layer of the display area DA is disposed in the non-display area NA. The driving circuit 610 may be formed as a chip. The driving circuit 610 is connected with a pad portion to transmit a driving signal to an emission layer, and controls the display area DA. The driving circuit 610 will be described in detail later.

Hereinafter, a pad portion in the non-display area NA, connected with the driving circuit 610 will be described. In the present embodiment, the pad portion is defined as a structure including the base substrate 100, the lower insulation layer 110, the first metal layer 200, the interlayer insulating layer 300, the second metal layer 400, a protective layer 410, the anisotropic conductive film 500, and the flexible circuit board 600 that are sequentially layered on the base substrate 100.

The base substrate 100 has a planar rectangular shape, and is formed as an insulation substrate made of glass, quartz, ceramic, plastic, and the like. Meanwhile, the base substrate 100 may have a bendable flexible structure.

The lower insulating layer 110 may be formed above the base substrate 100 and the first metal layer 200 may be formed above the lower insulating layer 110. In embodiments, the lower insulating layer 110 is provided between the base substrate 100 and the first metal layer 200 for insulation between the base substrate 100 and the first metal layer 200. The lower insulating layer 110 may be an inorganic layer including a material such as silicon nitride (SiNx) or silicon oxide ($SiO_2$).

The first metal layer 200 is connected with the driving circuit 610 through the anisotropic conductive film 500 such that it includes a driving gate electrode layer that can supply a scanning signal to the gate line. The first metal layer 200 is formed on the same layer as the gate electrode in the display area DA.

Meanwhile, as shown in FIG. 1, the molten portion 210 is formed in the first metal layer 200. The molten portion 210 may be lower in height than the first metal layer 200. The molten portion 210 may be made of a metal that is the same as the first metal layer 200.

In the present embodiment, the molten portion 210 is a structure formed by melting a part of the first metal layer 200 with heat such that the part has a predetermined pattern, but the embodiment is not limited thereto. After forming a groove on the first metal layer 200, the molten portion 210 may then be formed to protrude, as shown in FIG. 1.

The molten portion 210 may be formed by melting the part of the first metal layer 200 using a laser. In this case, a molten portion is formed by partially melting the first metal layer 200 and re-solidifying the melt portion such that the molten portion is formed. In a fluid state, the molten part of the first metal layer 200 fills fine gaps of the first metal layer 200 and the lower insulating layer 110 that neighbor the molten part, and accordingly a bonding force around the molten portion is reinforced by bonding. Further, in embodiments, the re-solidifying may cause the molten portion 210 to have a metallurgical microstructure substantially different from that of non-molten portions of the first metal layer.

Figure 2:
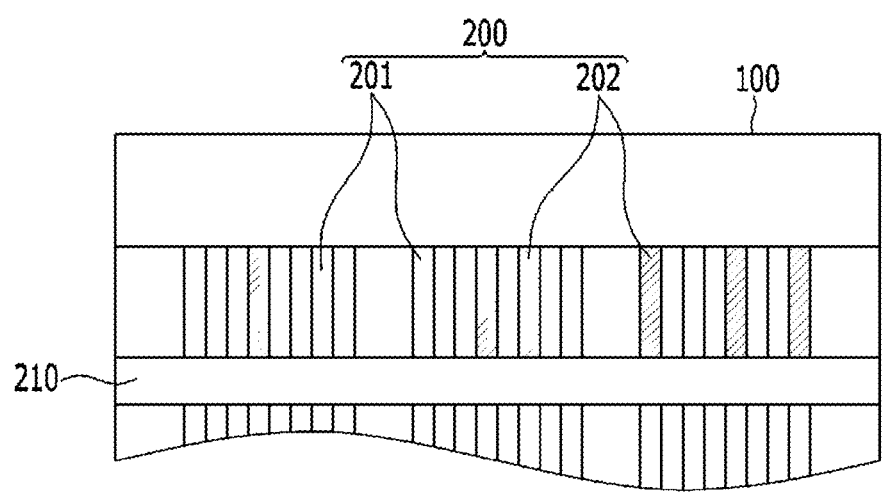
FIG. 2 is a top plan view of a pad portion where a flexible circuit board is removed in a rework process of the display device according to the embodiment.

FIG. 2 is a top plan view of the pad portion where the flexible circuit board is removed through a rework process in the non-display area NA of the display device according to the embodiment.

Referring to FIG. 2, the molten portion 210 may be disposed to be parallel with an end of the pad portion. As shown in FIG. 2, the molten portion 210 may be extended in a straight line parallel with the end of the pad portion, and in embodiments, the molten portion 210 may be extended in a zigzag or wave shape, or two or more molten patterns may be disposed in the shape of a slit toward the end of the pad portion.

Meanwhile, the molten portion 210 may be disposed farther away from the display area DA than the contact hole CNT.

In an existing display device, when a flexible circuit board is ripped off from an anisotropic conductive film during a rework process, a gate insulating layer or a driving gate electrode layer is ripped off together with the flexible circuit board when the flexible circuit board is ripped off due to the strong adhesiveness of the anisotropic conductive film.

However, in the present embodiment, as shown in FIG. 1, the molten portion 210 having a reinforced bonding force with the neighboring first metal layer 200 and lower insulating layer 110 are provided in the location of the first metal layer 200 such that even if rip-off occurs in the first metal layer 200 during the rework process, the ripping off can be easily prevented from spreading over the molten portion 210.

As shown in FIG. 2, the first metal layer 200 includes a first region 201 in which the metal layer maintains its normal location rather than being ripped off and a second region 202 in which the first metal layer is damaged by being ripped off during the rework process. In this case, the molten portion 210 blocks the spread of damage from the damaged first metal layer region 202 toward the display area DA.

Meanwhile, the interlayer insulating layer 300 is formed above the first metal layer 200. The interlayer insulating layer 300 is provided between the first metal layer 200 and the second metal layer 400 for insulation therebetween. The interlayer insulating layer 300 may be an inorganic layer including a material such as silicon nitride (SiNx) or silicon oxide ($SiO_2$).

In the interlayer insulating layer 300, a portion neighboring the molten pattern 210 is opened toward the molten portion 210. In embodiments, the interlayer insulating layer 300 is formed to wholly cover the first metal layer 200 and the molten portion 210, but since the molten portion 210 is processed by laser-processing the first metal layer 200, a portion that corresponds to an upper area of the molten portion 210 is opened by the laser. However, the structure of the interlayer insulating layer 300 of the present embodiment is not limited thereto. For example, the molten portion 210 may be formed first by laser-processing the first metal layer 200 before layering the interlayer insulating layer 300.

In addition, as shown in FIG. 1, the contact holes CNT are formed in the interlayer insulating layer 300 to partially electrically connect the first metal layer 200 and the second metal layer 400. In FIG. 1, two contact holes CNT are formed, but the number of contact holes CNT may be changed according to the type of first and second metal layers 200 and 400, a driving mechanism thereof, and the like.

As previously described, the contact hole CNT is formed closer to the display area DA compared to the molten portion 210, and thus the ripping-off of the first metal layer 200 during the rework process can be prevented from spreading to an area where the contact holes CNT are located.

For example, a large-size display device provided with a structure having a relatively large area has a rework process performance probability and requires a large area for the rework process so that the ripping off of the first metal layer 200 has a high possibly of spreading to an area where the contact hole CNT is located during the rework process. However, in the display device according to the present embodiment, the ripping off of the first metal layer 200 during the rework process is blocked by the molten portion 210 so that the area where the contact hole CNT is located is not affected, and accordingly, the wire rip-off that may occur during the rework process can be improved in a large-size display device such as a large-size television.

The second metal layer 400 is formed above the interlayer insulating layer 300, but is electrically connected with the first metal layer 200 through the contact hole CNT. The second metal layer 400 includes a driving data electrode layer that is connected to the driving circuit 610 through the anisotropic conductive film 500 to transmit a data signal to the data line. The second metal layer 400 is formed in the same layer as source-drain electrodes in the display area DA.

Meanwhile, a passivation layer 410 shown in FIG. 1 is formed above the interlayer insulating layer 300 and the second metal layer 400. In the present embodiment, the passivation layer 410 serves the same function as a planarization layer, and the planarization layer includes an electrode via hole VIA that partially exposes the second metal layer 400.

The passivation layer 410 may be made of one or more materials of polyacrylates resin, epoxy resin, phenolic resin, polyamides resin, polyimide resin, unsaturated polyester resin, poly phenylenethers resin, poly phenylenesulfides resin, and benzocyclobutene (BCB).

The anisotropic conductive film 500 is formed above the passivation layer 410. The anisotropic conductive film 500 includes a plurality of conductive balls such that the second metal layer 400 exposed through the electrode via hole VIA and the flexible circuit board 600 may be electrically connected to each other.

The flexible circuit board 600 is attached to the anisotropic conductive film 500. The chip-shaped driving circuit 610 is mounted on the flexible circuit board 600. Accordingly, a driving signal generated from the driving circuit 610 reaches the first metal layer 200 and the second metal layer 400 through the anisotropic conductive film 500 and the electrode via the hole VIA such that image driving of the display area DA can be controlled.

Hereinafter, an effect for improving wire rip-off in the pad portion by the molten portion during the rework process of the display device according to the embodiment will be described with reference to FIG. 3 to FIG. 5.

Figure 3:
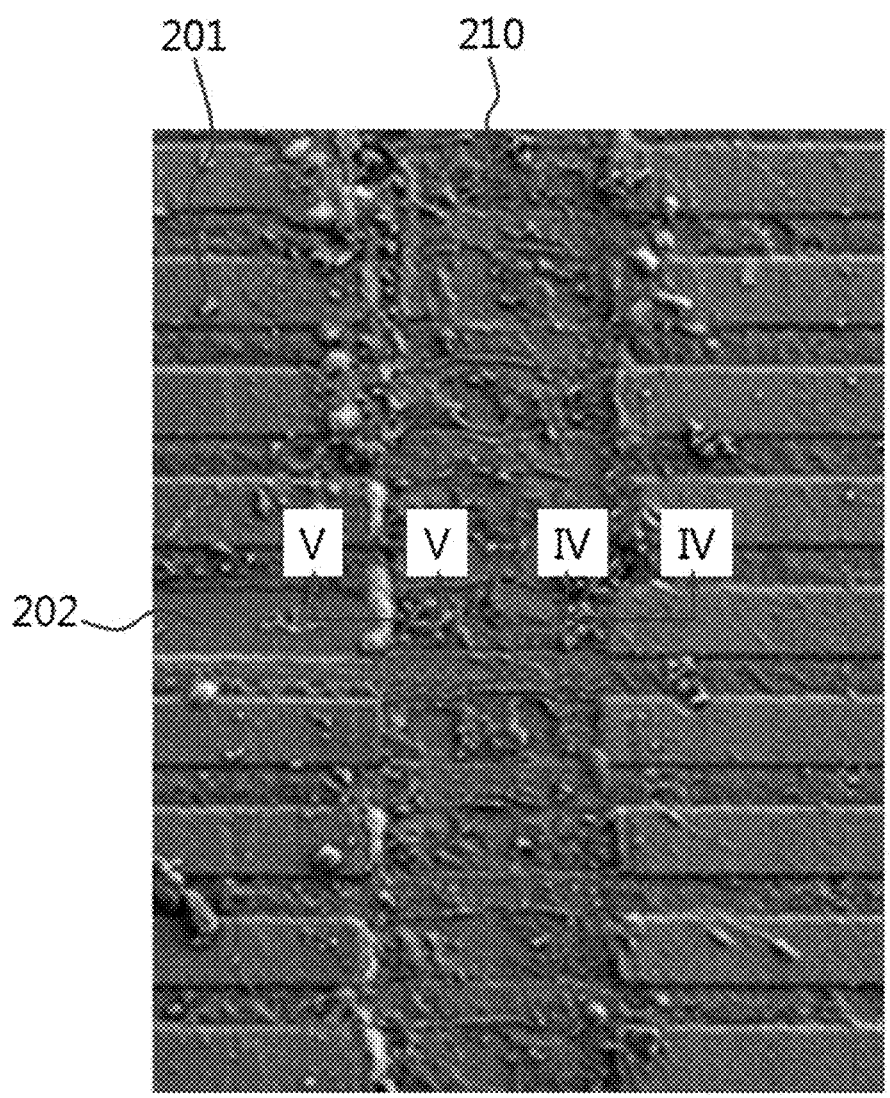
FIG. 3 is an enlarged image from a scanning electron microscope (SEM) of a pad portion where a molten portion of the display device is formed during the rework process according to the embodiment.
Figure 4:
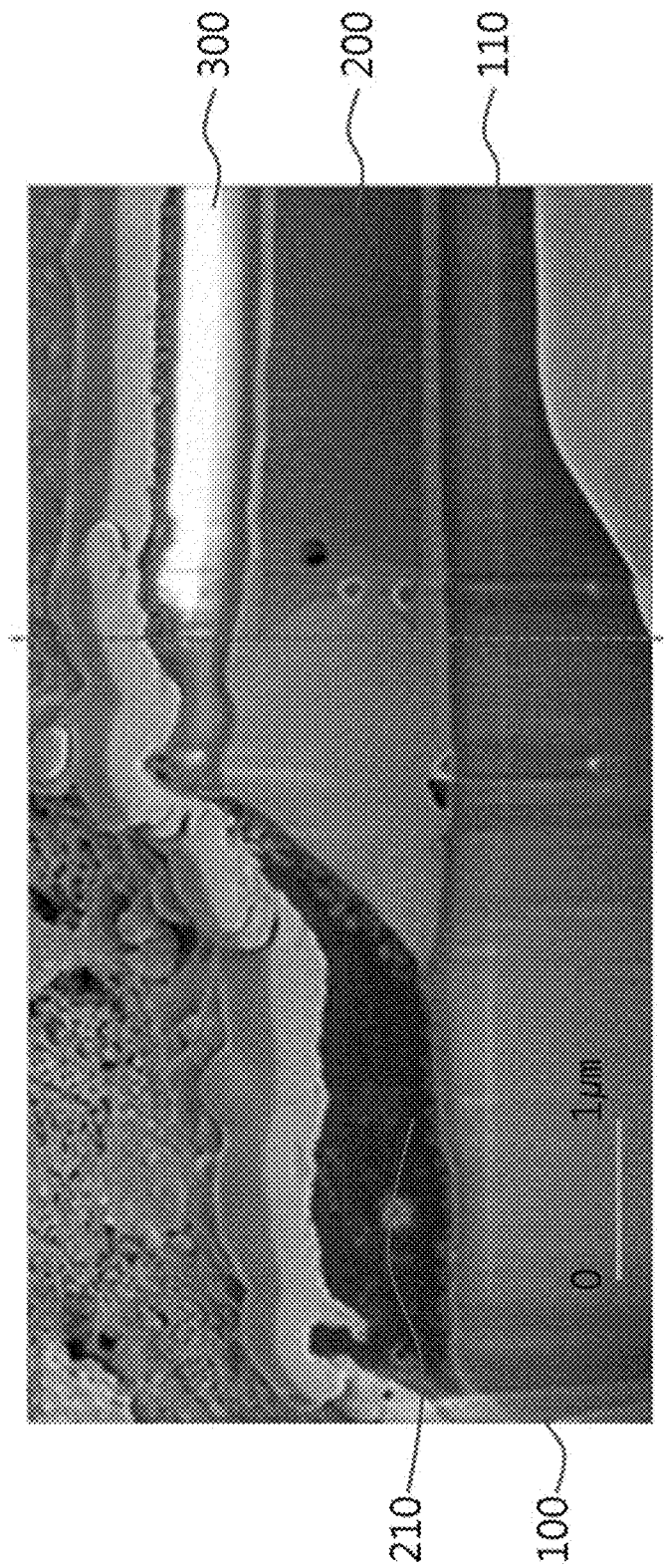
FIG. 4 is an enlarged view of FIG. 3, taken along the line IV-IV.

FIG. 3 is an enlarged scanning electron microscope (SEM) image of the pad portion where the molten portion is formed in the display device during the rework process of the display device according to the embodiment, and FIG. 4 is an enlarged view of FIG. 3, taken along the line V-V.

Referring to FIG. 3, the vertically extended molten portion 210 is formed in the pad portion of the display device. In FIG. 3, the display area DA is positioned on the right side with respect to the molten portion 210. In this case, the second region 202 of the first metal layer damaged from being ripped off during the rework process and the non-damaged first metal layer region 201 are exposed on the left side with respect to the molten portion 210. It is shown that the non-damaged first metal layer portion exists on the right side of the molten portion 210 because the spread of the rip-off of the first metal layer 200 is blocked by the molten portion 210. In embodiments, a region on the right side of the molten portion 210 is substantially free of ripping-off damages during the reworking process of the flexible circuit board.

Figure 5:
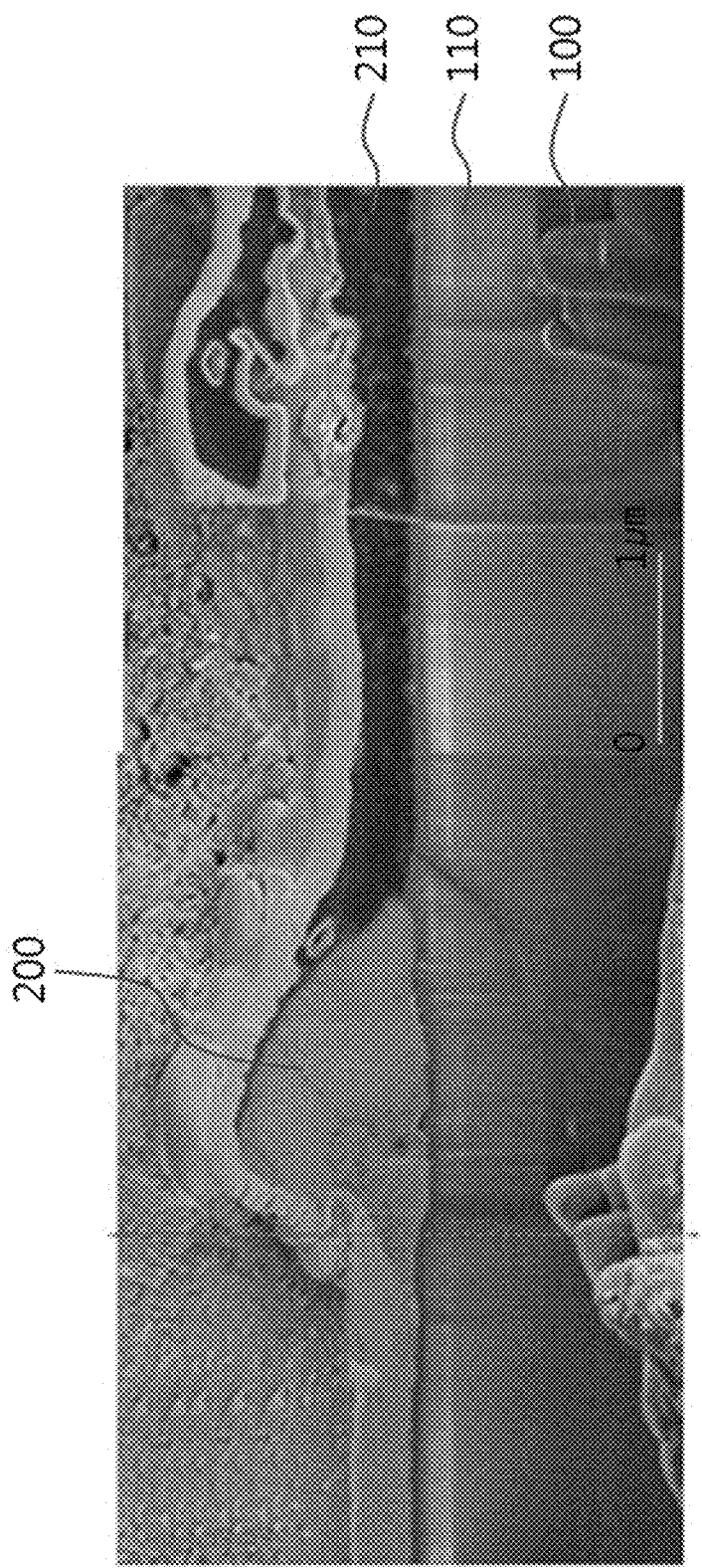
FIG. 5 is an enlarged view of FIG. 3, taken along the line V-V.

Referring to FIG. 4 and FIG. 5, the molten portion 210 is formed to be lower in height than the first metal layer 200. In embodiments, laser beams are irradiated toward the first metal layer 200 to melt the surface of the first metal layer 200 while the interlayer insulating layer 300 is disposed thereabove so that melted metal is bonded to the neighboring lower insulating layer 110, the first metal layer 200, and the interlayer insulating layer 300. Accordingly, the completed molten portion 210 has a concave pattern viewed as shown in FIG. 3 with respect to the first metal layer 200.

As described, in the display device according to the embodiment, the first metal layer 200 disposed in the non-display area NA and including the driving gate electrode layer is processed to form a predetermined molten portion 210 such that wire rip-off during the rework process can be prevented from spreading toward the display area DA.

Figure 6:
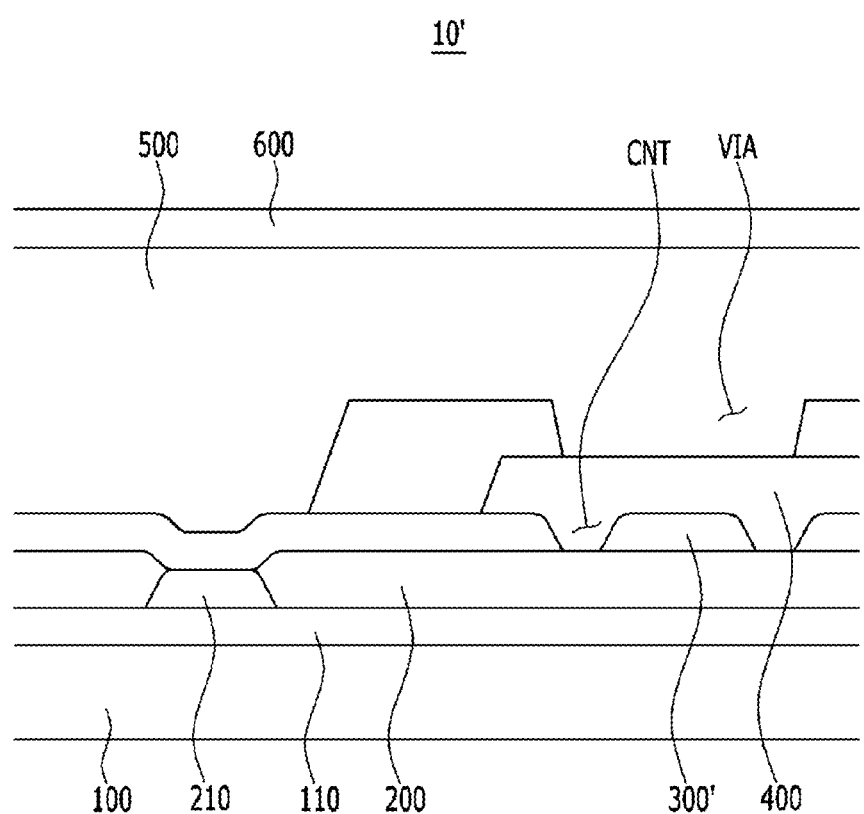
FIG. 6 is a schematic cross-sectional view of a display device according to another embodiment.

Hereinafter, a display device 10' according to another embodiment will be described with reference to FIG. 6. In the description of FIG. 6, the description of the same constituent elements of the display device 10 will not be duplicated.

FIG. 6 is a schematic cross-sectional view of a display device according to another embodiment.

Referring to FIG. 6, the display device 10' of the present embodiment is the same as the display device 10 of the above-described embodiment, except that an interlayer insulating layer 300' covers the upper surface of a molten portion 210.

In embodiments, in the display device 10' according to the present embodiment, the molten portion 210 is formed first by laser-processing a first metal layer 200 before layering the interlayer insulating layer 300', or a part of the first metal layer 200 is selectively heated using a heat source such as a flash lamp to form the molten portion 210 after layering the interlayer insulating layer pattern 300'.

As described above, in the display device according to the present embodiment, a predetermined molten portion is formed in the pad portion to reinforce a bonding force around the molten portion so that the ripping off of the wire in the pad portion during the rework process can be easily prevented from spreading toward the display area.

In addition, the molten portion can be formed not only in a small-size display device used in a mobile communication terminal, but also in a large-size display device such as a large-size television without a complex process, and accordingly, defects such as wire rip-off in the pad portion can be easily prevented.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising a display area which comprises an array of pixels configured to display an image and a non-display area connected to the display area, the display device comprising:

a base substrate;
a first metal layer formed over the base substrate;
an interlayer insulating layer formed over the first metal layer and comprising a contact hole;
a second metal layer formed over the interlayer insulating layer and connected with the first metal layer through the contact hole;
an anisotropic conductive film formed over the second metal layer and covering the contact hole; and
a flexible circuit board attached to the anisotropic conductive film and configured to transmit a driving signal for the array of pixels,
wherein the first metal layer comprises a molten portion formed in the non-display area.

2. The display device of claim 1, wherein a driving circuit is mounted over the flexible circuit board.

3. The display device of claim 1, wherein the first metal layer comprises a driving gate electrode layer.

4. The display device of claim 1, wherein the second metal layer comprises a driving data electrode layer.

5. The display device of claim 1, wherein the molten portion is disposed farther from the display area than the contact hole.

6. The display device of claim 1, wherein the first metal layer comprises first and second non-molten portions disposed between the flexible circuit board and the base substrate and separated from each other by the molten portion which is lower in height than the first and second non-molten portions of the first metal layer.

7. The display device of claim 1, wherein the molten portion is formed by irradiating a laser on a portion of the first metal layer to melt the portion and re-solidifying the portion.

8. The display device of claim 1, wherein the interlayer insulating layer comprises a hole to receive a portion of an anisotropic conductive film which contacts the molten portion.

9. The display device of claim 1, wherein the molten portion extends generally parallel to an edge of the base substrate.

10. The display device of claim 9, further comprising an additional molten portion disposed separately to be generally parallel to the molten portion.

11. The display device of claim 1, further comprising a lower insulating layer provided between the base substrate and the first metal layer.

* * * * *